United States Patent
Donaldson et al.

(10) Patent No.: US 7,096,451 B2
(45) Date of Patent: Aug. 22, 2006

(54) MESH PLANE GENERATION AND FILE STORAGE

(75) Inventors: Alice L. Donaldson, Milton, NY (US); Jason L. Frankel, Beacon, NY (US); John A. Ludwig, Woodstock, NY (US); Kenneth A. Papae, Lagrangeville, NY (US); Rafael Perez-Acevedo, Fishkill, NY (US); C. Timothy Ryan, Poughkeepsie, NY (US); Paul R. Walling, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 10/605,103

(22) Filed: Sep. 9, 2003

(65) Prior Publication Data
US 2005/0055660 A1 Mar. 10, 2005

(51) Int. Cl.
G06F 17/50 (2006.01)
H05K 1/00 (2006.01)

(52) U.S. Cl. .............................. 716/15; 716/20; 716/2; 716/16; 174/255

(58) Field of Classification Search ................. 716/20, 716/21, 16, 2, 15; 29/847; 174/255; 361/794, 361/805
See application file for complete search history.

(56) References Cited

U.S. PATENT DOCUMENTS

| | | | | |
|---|---|---|---|---|
| 5,327,254 A | | 7/1994 | Daher ......................... 382/298 |
| 5,347,465 A | | 9/1994 | Ferreri et al. ................. 716/19 |
| 5,410,107 A | * | 4/1995 | Schaper ....................... 174/255 |
| 5,812,380 A | | 9/1998 | Frech et al. ................. 361/794 |
| 5,930,498 A | * | 7/1999 | Tanaka .......................... 716/4 |
| 6,037,677 A | * | 3/2000 | Gottschall et al. ............ 307/43 |
| 6,255,600 B1 | * | 7/2001 | Schaper ....................... 174/255 |
| 6,297,460 B1 | * | 10/2001 | Schaper ....................... 174/261 |
| 6,311,313 B1 | * | 10/2001 | Camporese et al. ........... 716/6 |
| 6,316,738 B1 | * | 11/2001 | Mori et al. .................. 174/261 |
| 6,330,707 B1 | * | 12/2001 | Shinomiya et al. ........... 716/14 |
| 6,341,417 B1 | * | 1/2002 | Gupta et al. .................. 29/830 |
| 6,388,200 B1 | * | 5/2002 | Schaper ....................... 174/255 |
| 6,441,470 B1 | | 8/2002 | Shenoy ........................ 257/659 |
| 6,442,041 B1 | | 8/2002 | Rehm et al. ................. 361/760 |
| 6,498,396 B1 | | 12/2002 | Arimoto ....................... 257/737 |
| 6,528,735 B1 | | 3/2003 | Bhatia et al. ................ 174/260 |
| 6,541,709 B1 | * | 4/2003 | Franklin et al. ............. 174/255 |
| 6,611,267 B1 | * | 8/2003 | Migdal et al. ............... 345/428 |
| 6,657,130 B1 | * | 12/2003 | Van Dyke et al. .......... 174/255 |

(Continued)

OTHER PUBLICATIONS

Johnson et al., "Using Spin Images for Efficient Object Recognition in Cluttered 3D Scenes", IEEE Transactions on Pattern Analysis and Machine Intelligence, vol. 21, No. 5, May 1999, pp. 433-449.*

Primary Examiner—Phallaka Kik
(74) Attorney, Agent, or Firm—James J. Cioffi; Hoffman, Warnick & D'Alessandro LLC

(57) ABSTRACT

A method, system and program product implementing storage of a (power or ground) mesh plane file using a multiple line shape, possibly with the storage of lines also, to reduce file size. In addition, the invention implements an activate-substantial-portion-and-remove technique to generate mesh planes rather than the conventional additive approach, which improves the speed of designing the IC carriers. A resulting mesh plane design file may be as much as half the size of a file generated using the conventional line-by-line and storage approaches.

28 Claims, 13 Drawing Sheets

U.S. PATENT DOCUMENTS

| | | | |
|---|---|---|---|
| 2001/0013422 A1* | 8/2001 | Schaper | 174/250 |
| 2001/0029601 A1* | 10/2001 | Kimura et al. | 716/19 |
| 2001/0047588 A1* | 12/2001 | Schaper | 29/847 |
| 2002/0023779 A1* | 2/2002 | Gupta et al. | 174/262 |
| 2003/0051910 A1* | 3/2003 | Dyke et al. | 174/262 |
| 2004/0117751 A1* | 6/2004 | Shrowty et al. | 716/12 |
| 2004/0128641 A1* | 7/2004 | Broberg et al. | 716/18 |
| 2005/0039154 A1* | 2/2005 | Nguyen et al. | 716/13 |

\* cited by examiner

US 7,096,451 B2

MESH PLANE GENERATION AND FILE STORAGE

BACKGROUND OF INVENTION

The present invention relates generally to integrated circuit design, and more particularly, to generation of a mesh plane for a chip module design and a related file storage technique.

A mesh plane is a structure of interconnected lines in a cross-hatch pattern (90-degree relative angles) on a given layer of a single-chip or multiple chip module (SCM or MCM), used to tie power or ground vias together. A mesh plane provides both a means of lowering the inductance of the power/ground connections, and of providing noise shielding and power/ground coupling to the signal lines above and below the given layer. Mesh planes include difficult areas to design, such as a chipsite and other dense via regions, which require careful consideration to assure proper connections for the power and ground networks.

Conventionally, mesh planes are designed for an IC carrier design manually. In particular, mesh planes are conventionally designed by an additive approach in which features are added line-by-line to a field until the design is complete. This process is slow and tedious work. For example, FIG. 1 illustrates a particular sub-layout 10 of lines within a mesh plane. Each line within sub-layout 10 must be manually entered, which takes time and patience.

Another shortcoming of the above approach is that conventional IC carrier design tools store each line as a separate feature for storage purposes. Conventional chip module design tools also treat each "T" junction of active lines as a line break point 12. (Crossing of lines do not cause a similar segmentation). For example, sub-layout 10 includes twelve features in total: two crossed lines 14 at each corner and then four lines 16 coupling line break points 12 to a via 18 (size exaggerated so viewable) in the center. Each of these twelve lines or features are stored separately. An unfortunate result of this line-by-line storage approach is that as IC carrier design has increased in complexity, the ultimate IC design files have become very large, which makes storage difficult and may burden system resources, e.g., during revisions.

In view of the foregoing, there is a need in the art for a way to generate a mesh plane for an IC design that does not suffer from the problems of the related art.

SUMMARY OF INVENTION

The invention includes a method, system and program product implementing storage of a (power or ground) mesh plane file using a multiple line shape, possibly with the storage of lines also, to reduce file size. In addition, the invention implements an activate-substantial-portion-and-remove technique to generate mesh planes rather than the conventional additive approach, which improves the speed of designing the IC carriers. A resulting mesh plane design file may be decreased by as much as half the size of a file generated using the conventional line-by-line and storage approaches.

A first aspect of the invention is directed to a method of generating a mesh plane for an IC carrier design, the mesh plane being defined on a field of grid points, the method comprising the steps of: activating a substantial portion of grid points of an intended mesh plane with active lines; and removing at least one active line to generate the mesh plane.

A second aspect of the invention is directed to a method of generating a mesh plane for an IC carrier design, the method comprising the steps of: generating a mesh plane having a plurality of active lines; and storing a set of active lines of the mesh plane as a multiple line shape.

A third aspect of the invention is directed to a computer program product comprising a computer useable medium having computer readable program code embodied therein for generating a mesh plane for an IC carrier design where the mesh plane is defined on a field of grid points, the program product comprising: program code configured to activate a substantial portion of grid points of an intended mesh plane with active lines; and program code configured to remove at least one active line to generate the mesh plane.

A fourth aspect of the invention is directed to an IC carrier design system comprising: a mesh plane generating unit including: means for activating a substantial portion of grid points of an intended mesh plane with active lines, the grid points being part of a field used to define the mesh plane; and means for removing at least one active line to generate the mesh plane; and a mesh plane storage unit including means for storing a set of active lines of the mesh plane as a multiple line shape.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 2:
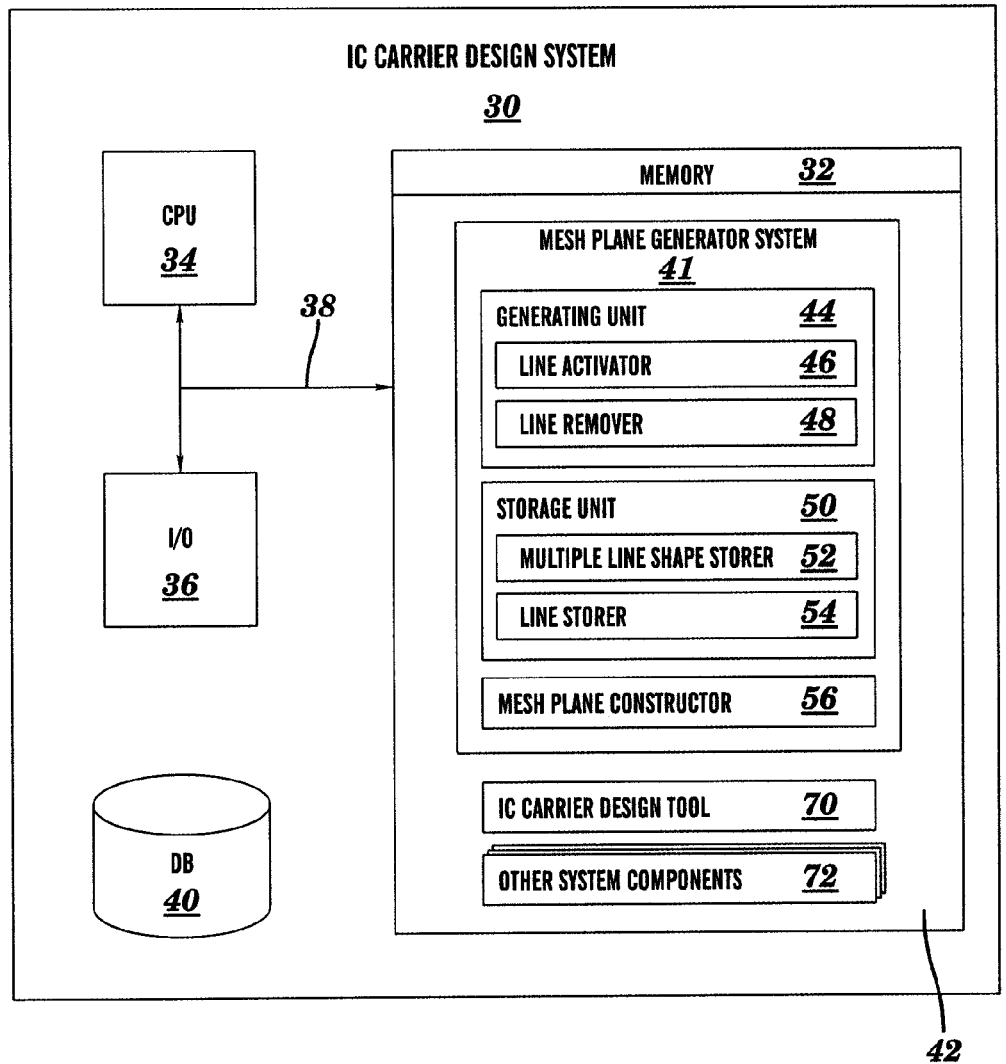
FIG. 2 shows an IC carrier design system including a mesh plane generating system according to the invention.

With reference to the accompanying drawings, FIG. 2 is a block diagram of an IC carrier design system 30 in accordance with the invention. System 30 includes a memory 32, a central processing unit (CPU) 34, input/output devices (I/O) 36 and a bus 38. A database 40 may also be provided for storage of data relative to processing tasks. Memory 32 includes a program product 42 that, when executed by CPU 34, comprises various functional capabilities described in further detail below. Memory 32 (and database 40) may comprise any known type of data storage system and/or transmission media, including magnetic media, optical media, random access memory (RAM), read only memory (ROM), a data object, etc. Moreover, memory 32 (and database 40) may reside at a single physical location comprising one or more types of data storage, or be distributed across a plurality of physical systems. CPU 34 may likewise comprise a single processing unit, or a plurality of processing units distributed across one or more locations. I/O 36 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 2, program product 42 may include a mesh plane generation system 41 including: a mesh plane generating unit 44 including a line activator 46 and a line remover 48; a mesh plane storage unit 50 including a multiple line shape storer 52 and a line storer 54; and a mesh plane constructor 56. In addition, program product 42 may include any now known or later developed IC carrier design tool 70 and any other system component(s) 72 that may be used with a conventional IC carrier design system 30. Although mesh plane generation system 41 will be described as part of an IC carrier design system 30, it should be recognized that system 41 may be implemented separately in a fashion that is compatible with a variety of different IC carrier design systems 30. The operation of program product 42 will become apparent from the following description of operation.

Figure 3:
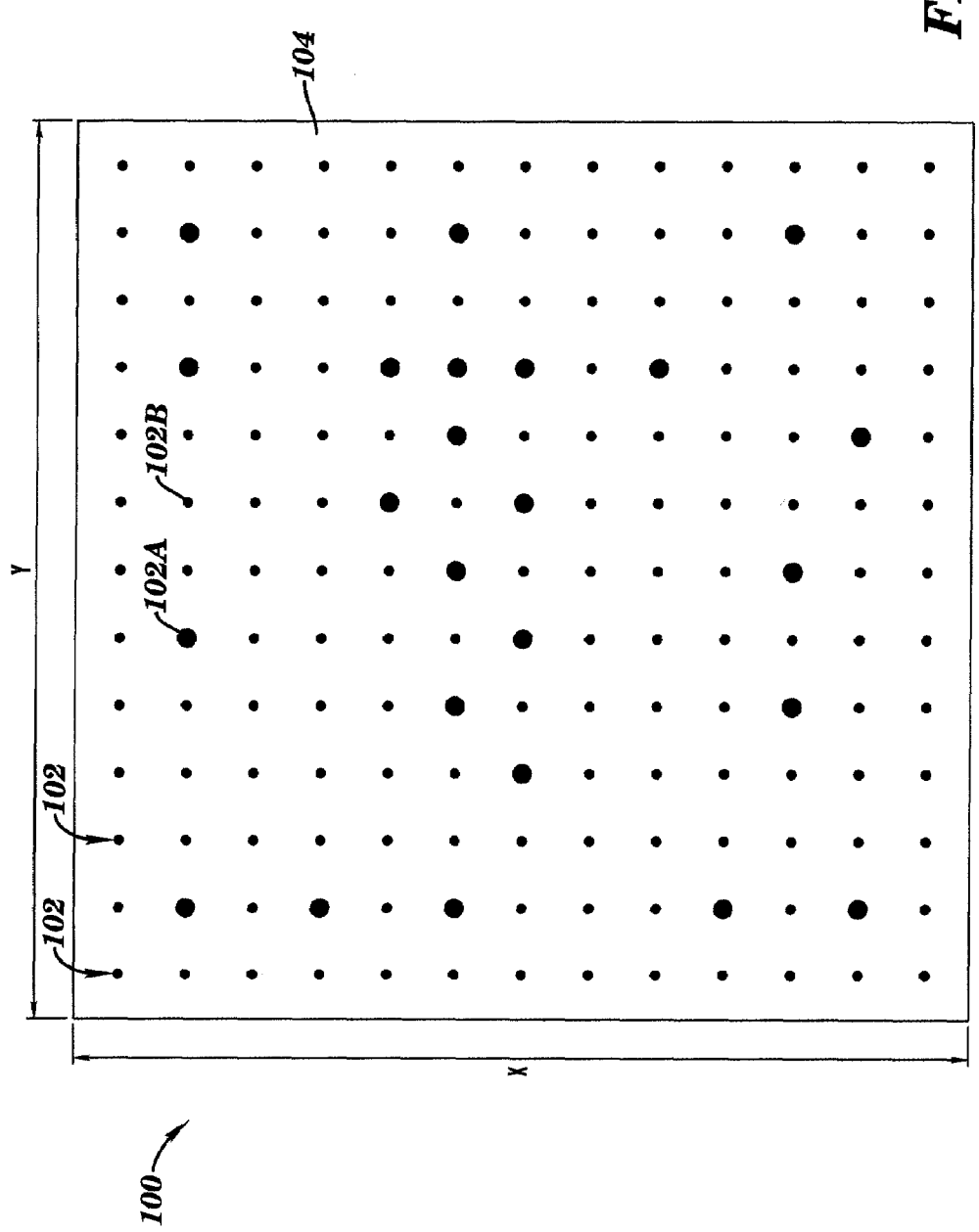
FIG. 3 shows a two-dimensional field including a plurality of grid points for defining a mesh plane.

As noted above, a "mesh plane" is a structure of interconnected lines in a cross-hatch pattern (90-degree relative angles) on a given layer of an IC carrier design, used to tie power or ground vias together. Referring to FIGS. 3, 5–11, conventionally, a mesh plane is defined on a field 100 that is displayed (via I/O 36 of FIG. 2) as part of a graphical user interface (GUI) of an IC carrier design system 30, or mesh plane generation system 41. Since the make up of a GUI varies from system-to-system, the details have been omitted for clarity. Referring to FIG. 3, a field 100 is two-dimensional (x-y), and includes a grid of points 102 (hereinafter "grid points 102") upon which an intended mesh plane 104 (not actually shown) is defined. For purposes of clarity, only a thirteen grid point by thirteen grid point field will be shown in the disclosure. It should be recognized that a mesh plane field includes any number of grid points. Grid points 102 are used to define preferable wire routing and via locations. In the example shown in FIG. 3, large dots 102A indicate via locations and smaller dots 102 B indicate preferred wire routing locations. For purposes of description, we will assume that a mesh plane to be designed is for a ground network. It is understood, however, that mesh planes are designed for different power and ground levels within an IC carrier.

Figure 4:
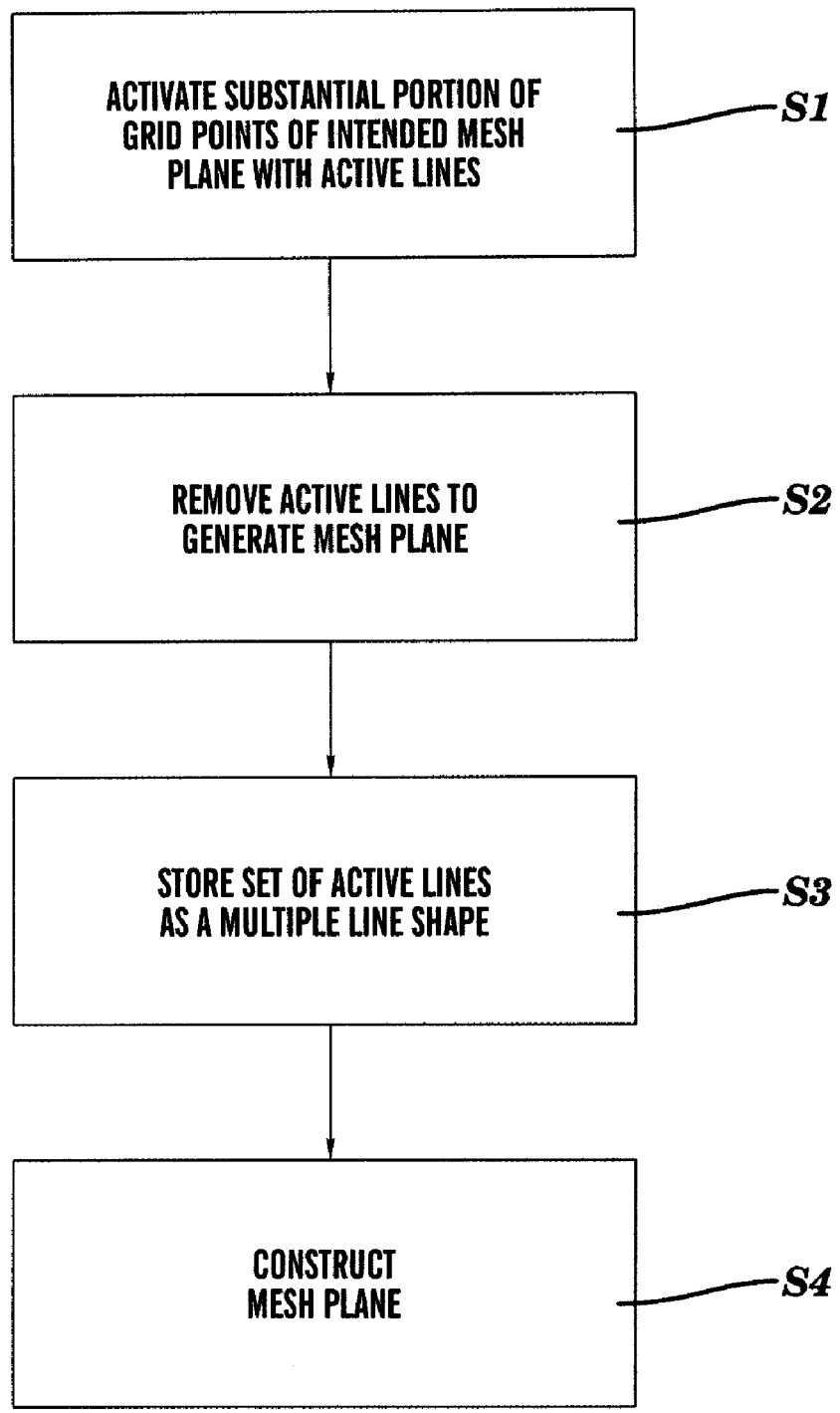
FIG. 4 shows a flow diagram of a mesh plane generating technique.

Referring to FIG. 4, a flow diagram of methodology applicable to system(s) 30, 41 relative to generation of a mesh plane is shown. Operation of IC carrier design tool 70 is as generally understood by those with skill in the art, and will not be discussed further. A preliminary step (not shown) of the method may include inputting mesh plane design specific parameters such as: layer number; network the mesh plane is to connect to, e.g., ground, power or signal; base grid density, e.g., 0.5 mm; line width; overall size of plane (i.e., field); etc. One particular input may include a via pattern (shown in FIG. 7), which is generated in a conventional fashion. A "via pattern" defines the location of different network vias, and determines where vias connect to the particular mesh plane and where they pass through.

Figure 5:
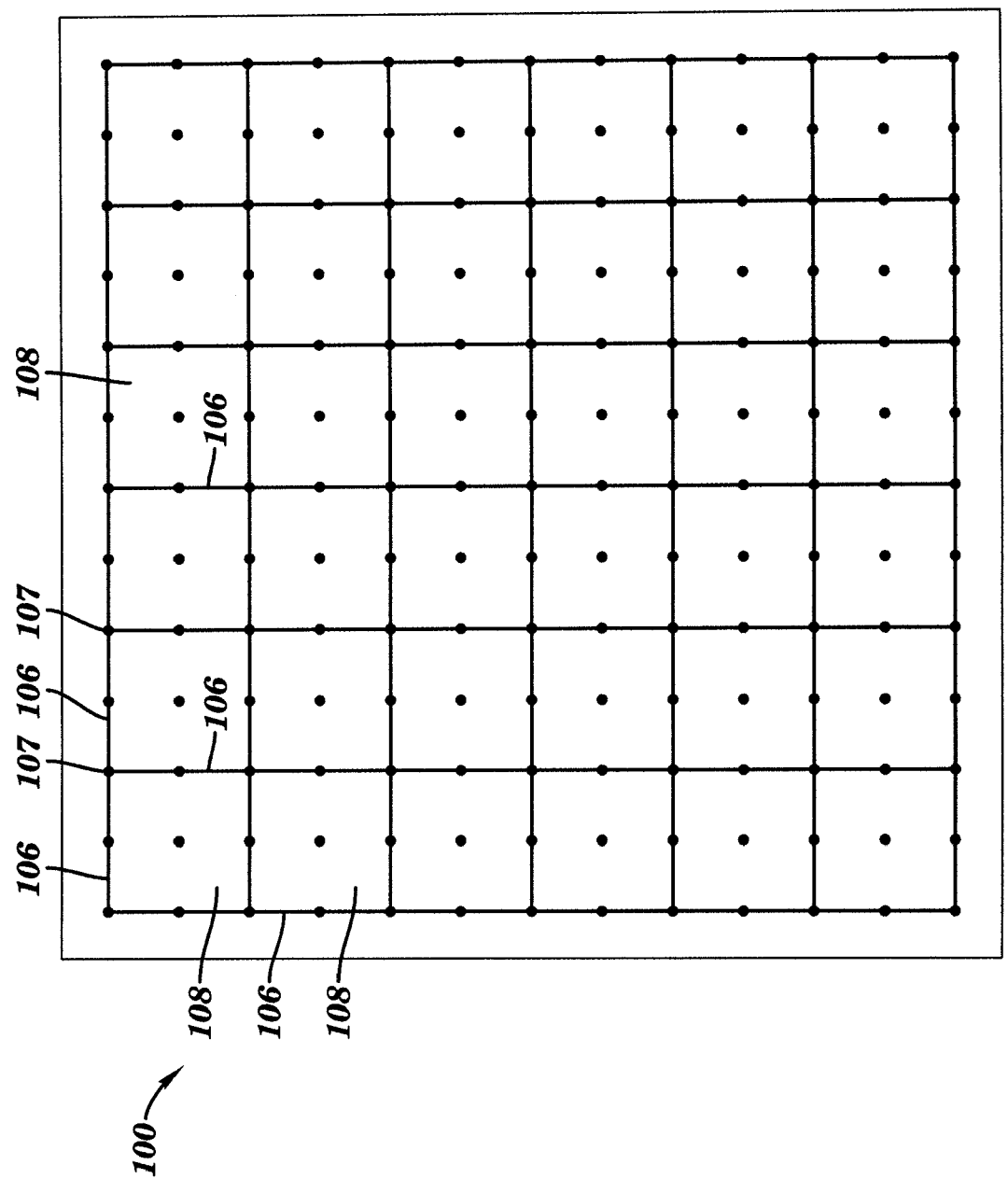
FIG. 5 shows activation of a base grid density of the mesh plane of FIG. 4.
Figure 6:
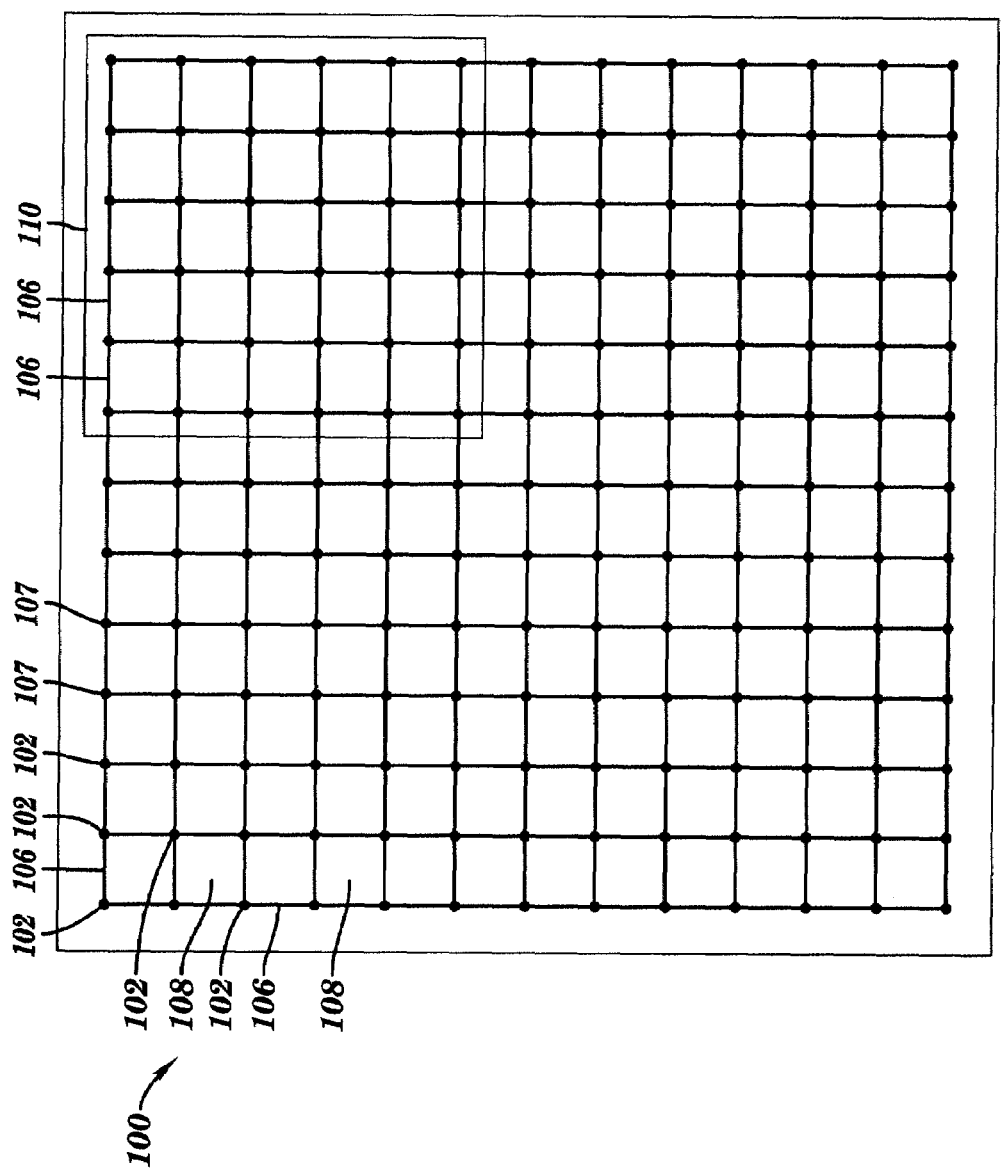
FIG. 6 shows double density activation of mesh plane of FIG. 4.

In a first step S1 (FIG. 4) of operation, a substantial portion of grid points 102 of a field 100 for an intended mesh plane with active lines 106 is activated by line activator 46 (FIG. 2) as shown in FIG. 5. By "activating" is meant that system(s) 30, 41 acts to energize a representation of a line that may ultimately be formed as a wire as part of mesh plane. An "active line" 106 is a feature which denotes where a wire will ultimately be formed, i.e., using well known post mesh plane generation techniques. Although lines appear as continual in FIG. 5, active lines 106 are initially interpreted as segmented at each "T" junction 107 such that each individual cell 108 is formed by at least 4 active lines. Step S1 may also include initially activating to a selected base grid density (FIG. 5) as input by a user and then doubling the density of the grid, as shown in FIG. 6. That is, for a base grid density having 0.5 mm active line center to active line center pitch, active lines 106 (and grid points 102) would be changed to result in a 0.25 mm active line center to active line center pitch. Again, although appearing continual, active lines 106 are initially interpreted as segmented at each "T" junction 107 such that each individual cell 108 is formed by at least 4 active lines. In any event, each grid point 102 of the intended mesh plane is coupled by an active line 106 to adjacent grid points 102 that are within field 100 and east, north, south and west thereof. For later reference, the substantially filled mesh plane will be referred to as a "saturated plane" 108 (FIGS. 5 and 6).

A "substantial portion" is defined to include a large enough portion, e.g., a majority, of grid points 102 such that an intended mesh plane can be formed without addition of active lines, i.e., solely by removal of active lines. It should be recognized that the size of field 100 may vary according to user preference. In addition, while an entire field 100 has been shown filled with active lines 106, a field may not necessarily require all possible lines activated. For example, a particular sub-field 110 (FIG. 6) within a field 100 may be denoted as "of interest" and only a substantial portion of active lines within sub-field 110 activated.

Returning to FIG. 4, a second step, step S2, includes line remover 48 removing at least one active line 106 (FIGS. 5 and 6) to generate the mesh plane. Reduction of the number of active lines 106 is necessary because a mesh plane containing too many wires is less manufacturable. Removal of at least one active line allows for easier and quicker generation of mesh planes compared to the prior art line-by-line additive approach. The step of removing may occur in a number of ways.

Figure 7:
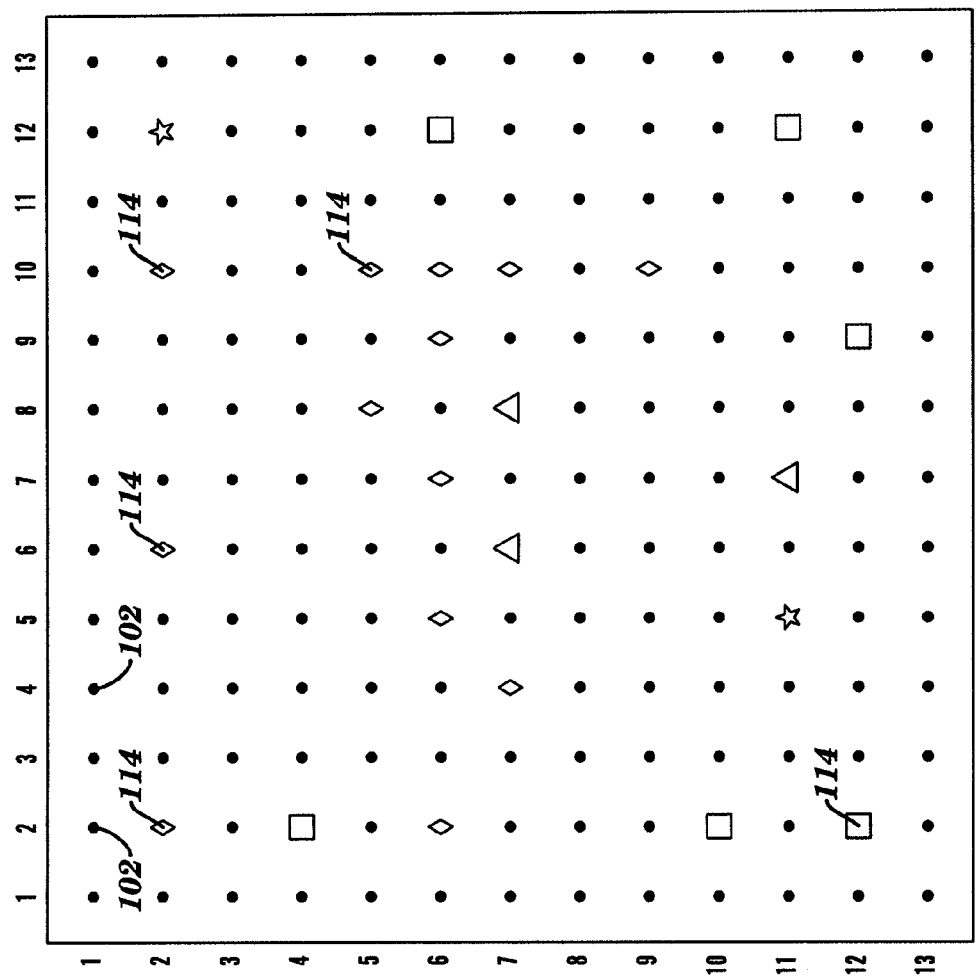
FIG. 7 shows a via pattern for use with mesh plane generation.

Illustrative ways in which an active line may be removed will now be discussed relative to FIGS. 7–11. Comparing FIG. 7 to FIG. 8, one way active lines may be removed includes removal of active lines on grid points denoted as part of other network features. That is, any active line 106 that is connected to a grid point 102 associated with (over) a passthrough via that is not of the same network as the mesh plane is removed. For example, FIG. 7 illustrates a via pattern 112 indicating at which grid points 102 vias 114 are located. The network type of a via 114 may be discerned, for example, by color on a display. For purposes of description, however, vias 114 network type has been indicated by shapes in FIG. 7 as follows: a ground via is indicated by a square, a power via is indicated by a diamond, and signal vias are indicated either by a star or a triangle. Similarly, a passthrough via(s) and a connected via(s) may be distinguished on a display, for example, by the brightness of the display. In our example of a ground mesh plane, at least one of the ground vias (squares) is connected to the mesh plane. Comparing FIG. 7 to FIG. 8, via pattern 112 is compared to saturated plane 108 (FIG. 6) and active lines (at locations 116) that connect to a grid point associated with a passthrough via 114 have been removed. In the case of a ground mesh plane, grid points where power (diamond) and signal (star or triangle) vias are located have active lines connected thereto removed. In contrast, where a ground via (square) passes through or connects to the mesh plane, active lines 106 remain.

Figure 8:
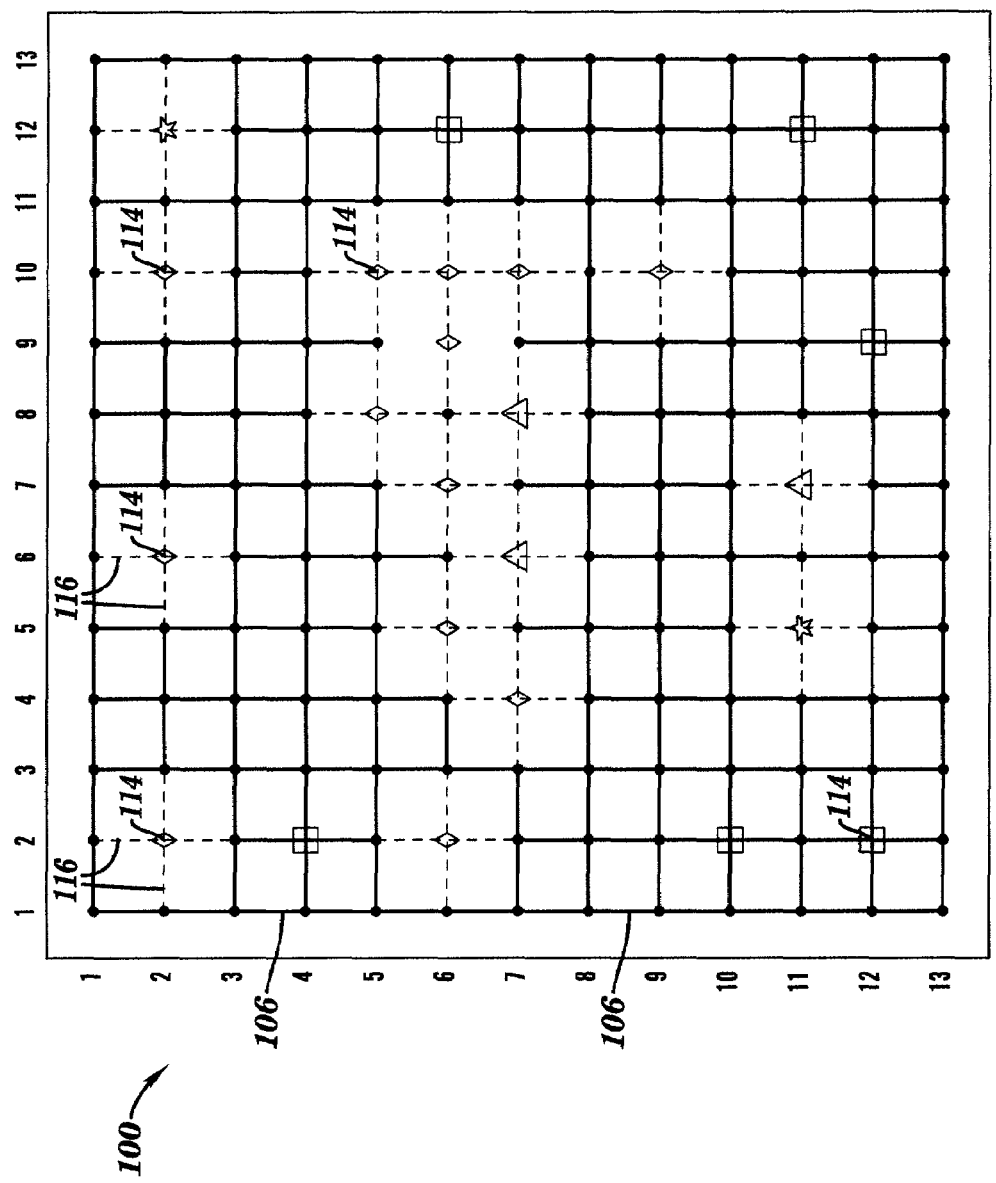
FIG. 8 shows a step of active line removal according to a first embodiment.
Figure 9:
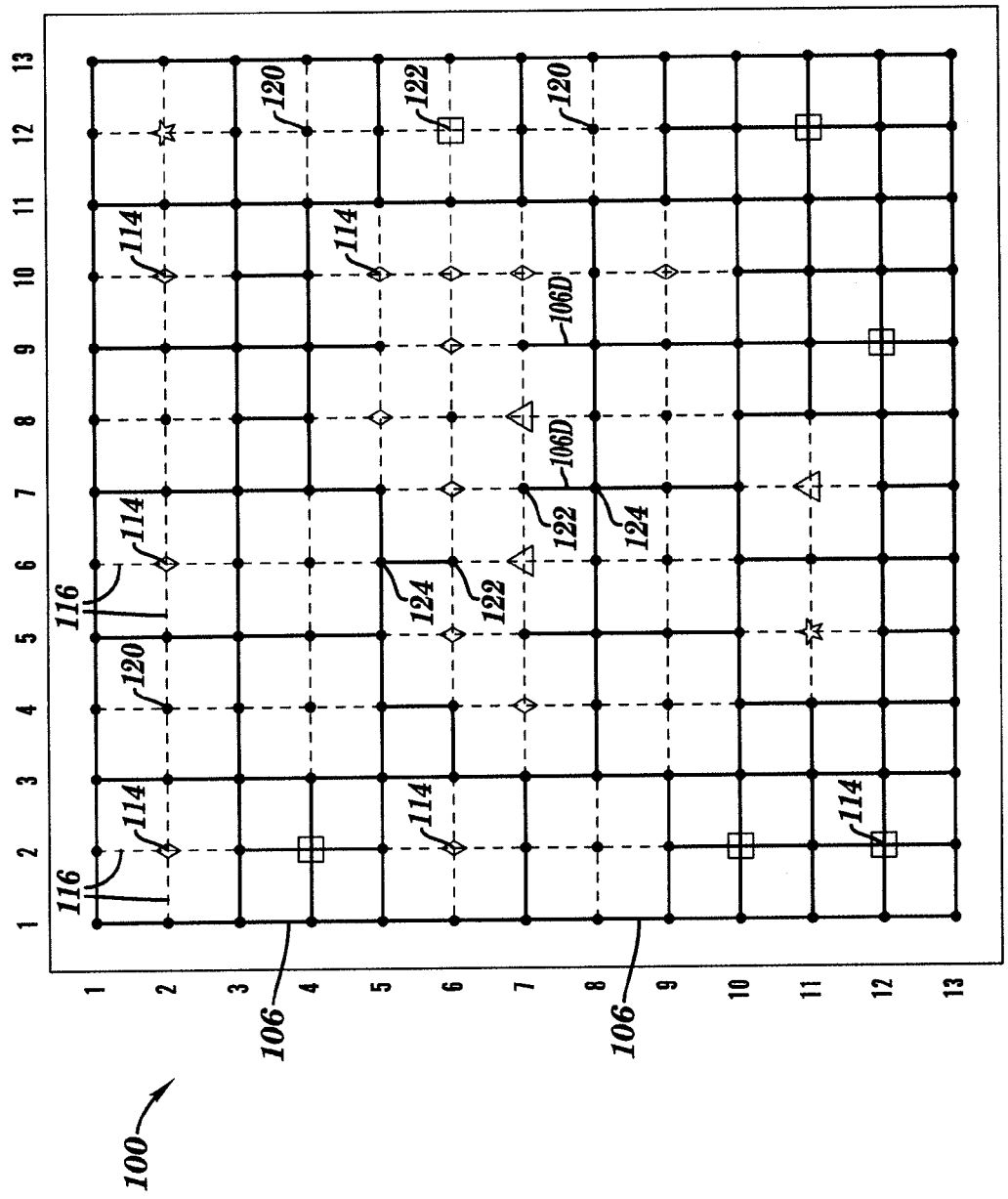
FIG. 9 shows a step of active line removal according to a second embodiment.

As shown by comparing FIGS. 8 and 9, another way active lines 106 may be removed includes removing at least one, and preferably all, active line(s) 106 between a surrounded grid point 120, which is surrounded by other grid points 102 that are not on a via 114, and the other grid points. The number of other grid points 102 necessary to denote a grid point as "surrounded" may vary. In the example shown, eight other grid points 102 are necessary for a "surrounding" denotation, which indicates a preference to maintain a continuous border of active lines about field 100. In this case, four active lines 106 are removed for each surrounded grid point 120, and only plus "+" shaped groupings of active lines 106 are removed. It should be recognized, however, that other situations may exist where less than or more than four active lines may be removed are possible.

Figure 10:
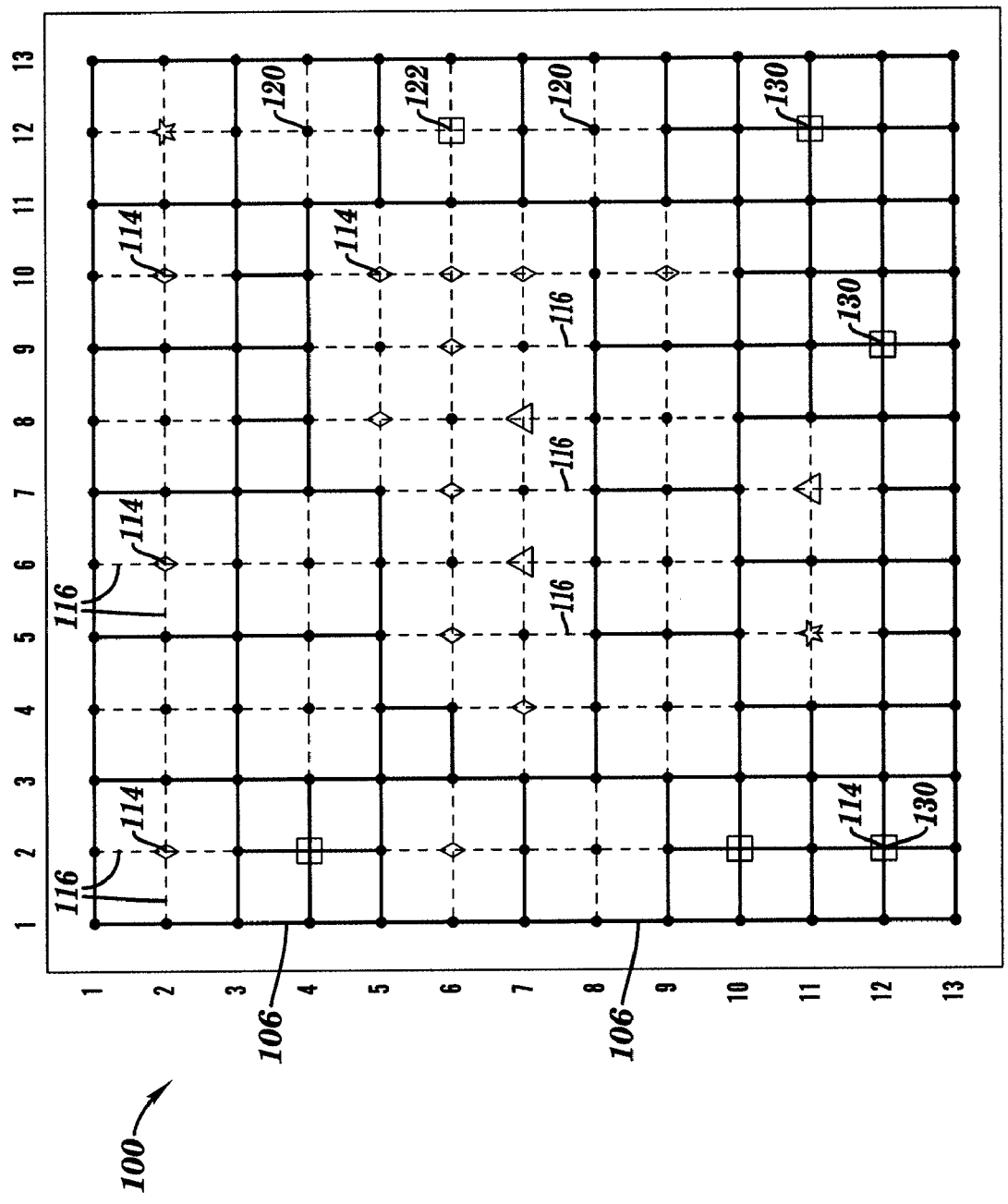
FIG. 10 shows a step of active line removal according to a third embodiment.

As shown by comparing FIGS. 9 and 10, another way active lines 106 may be removed is by removing any single active line 106D between a dangling grid point 122 that is not associated with a via and only one other grid point 124. This removal step removes "dangling lines" that are unnecessary, as shown in FIG. 9 but removed in FIG. 10 as indicated at locations 116.

Figure 11:
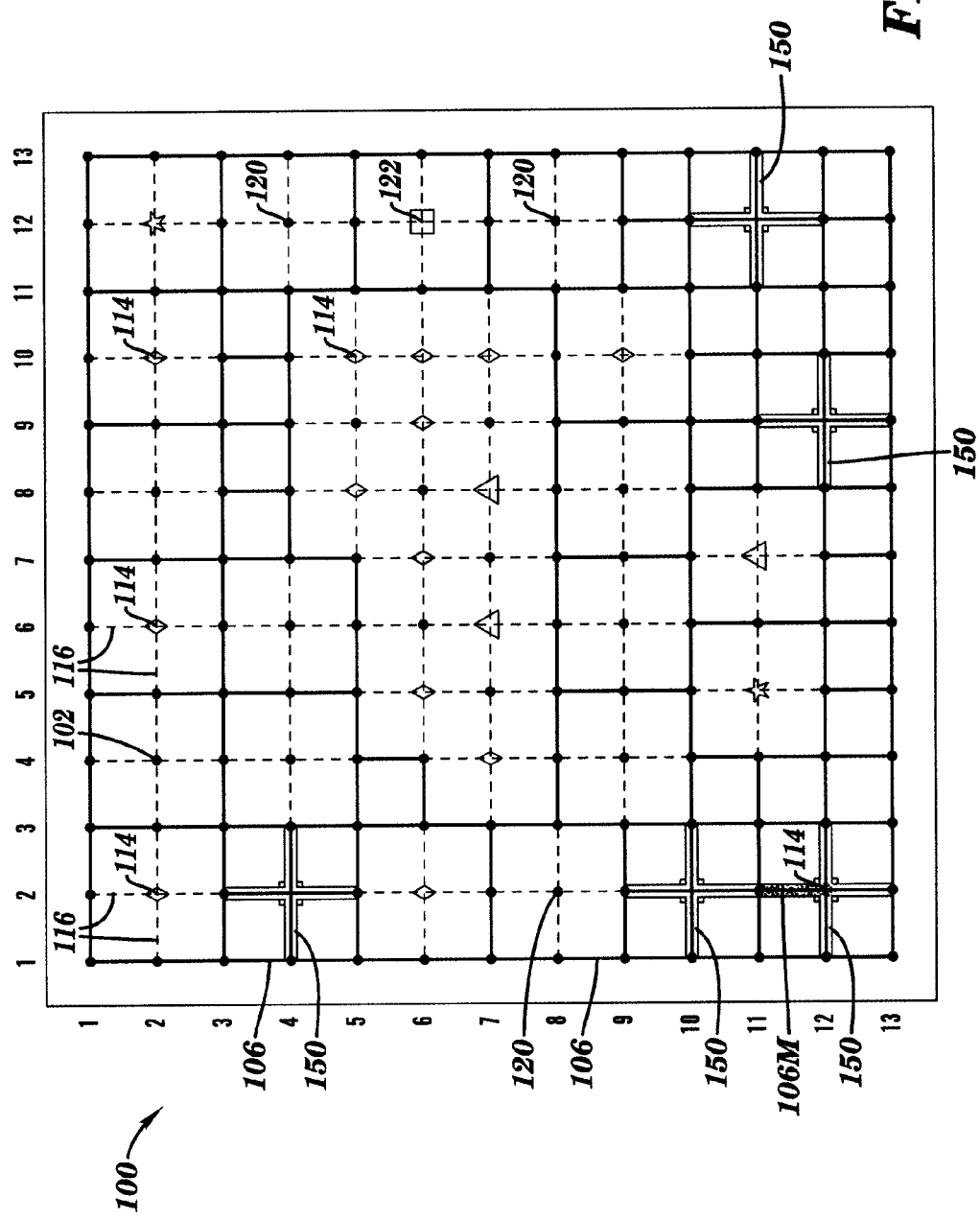
FIG. 11 shows multiple line shapes of the mesh plane used for storage.

Returning to FIG. 4, a third step S3 of the method includes storing a set of active lines of the mesh plane as a multiple line shape using storage unit 50 (FIG. 2). In particular, as shown in FIG. 11, remaining active lines 106 are evaluated to identify a recurring multiple line shape 150 using multiple line shape storer 52. The evaluation may include identifying another surrounded grid point 130 (FIG. 10), which is surrounded by other grid points 102 that are not on a via 114. In most cases, because of the prior removal steps, most surrounded grid points 130 will be associated with a via 114. In one embodiment, a multiple line shape 150 is a plus "+" shape, which includes four active lines 106 joined at a grid point 102. However, it should be recognized that other multiple line shapes are also possible such as: a right angle, a square, a rectangle, a grid, etc. Where a surrounded grid point 130 is associated with a via that ends at the particular mesh plane being generated, multiple line shape 150 may include an active line 106M to indicate connection of the mesh plane to that via. Storage of recurring multiple line shapes 150 by multiple line shape storer 52 (FIG. 2) allows for a large reduction in file size for the mesh plane. In addition, the saving step includes storing a plurality of collinear active lines 106 as an un-segmented line using line storer 54 (FIG. 2). This is in contrast to prior art methodology, which treats each "T" junction as segmented lines 14 (FIG. 1).

As shown in FIG. 4, a final step, step S4, may include reconstructing a mesh plane from a stored file using mesh plane constructor 56 (FIG. 2) based on multiple line shapes 150. This step may include reconstructing any stored multiple line shapes 150 as active lines 106 to return to the desired mesh plane, as shown in FIG. 10, and generating a graphical representation of the mesh plane. This step may require, for example, making the mesh plane file compatible with conventional fabrication equipment.

Figure 1:
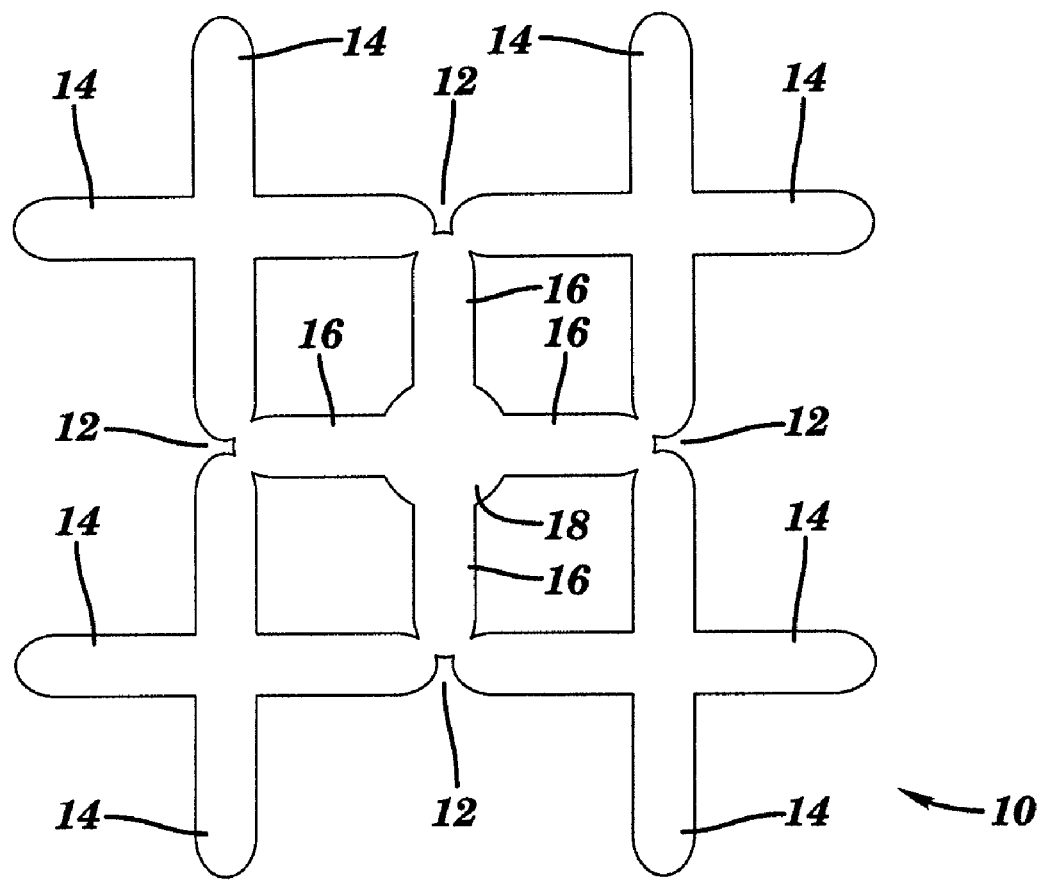
FIG. 1 shows a prior art IC carrier design tool interpretation of a sub-layout of a mesh plane.
Figure 12:
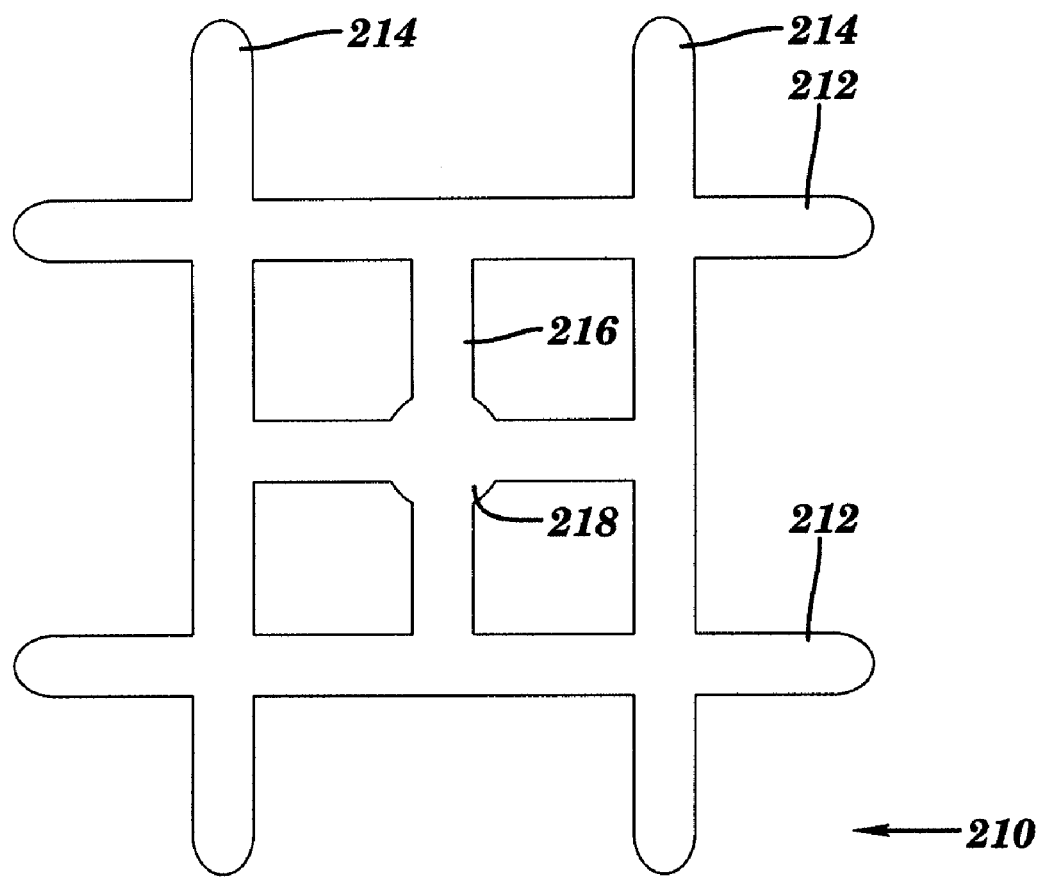
FIG. 12 shows an interpretation of a sub-layout of prior art FIG. 1 according to the invention.

To illustrate the advantages of the above-described invention, FIG. 12 illustrates how system(s) 30, 41 of the invention treat the same sub-layout as described relative to prior art FIG. 1. In particular, system(s) 30, 41 treat the sub-layout as including five features: two horizontal lines 212, two vertical lines 214, and a multiple line+shape 216 (over a via 218). That is, multiple line shape 216 is one feature rather than the four of FIG. 1, and collinear active lines are treated as single features resulting in four features rather than the eight of FIG. 1.

Figure 13A:
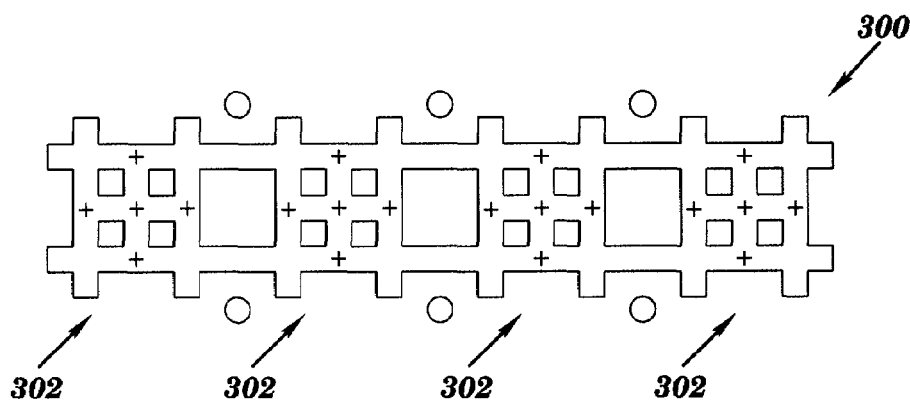
FIG. 13A–13C show comparison interpretations of a sub-layout of a mesh plane.
Figure 13B:
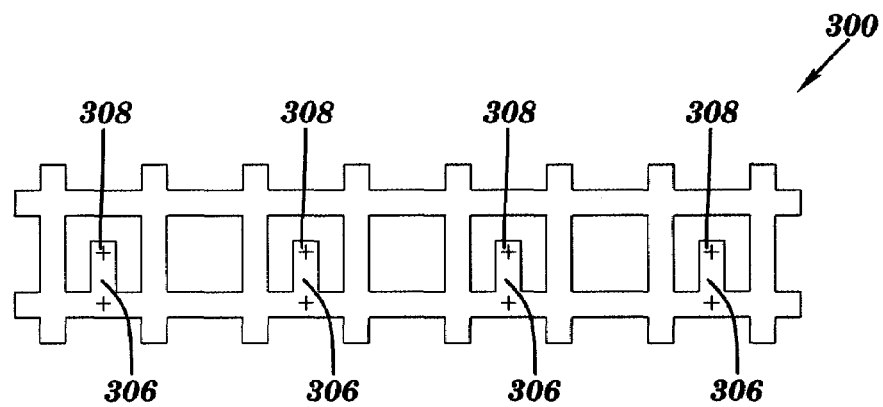
Figure 13C:
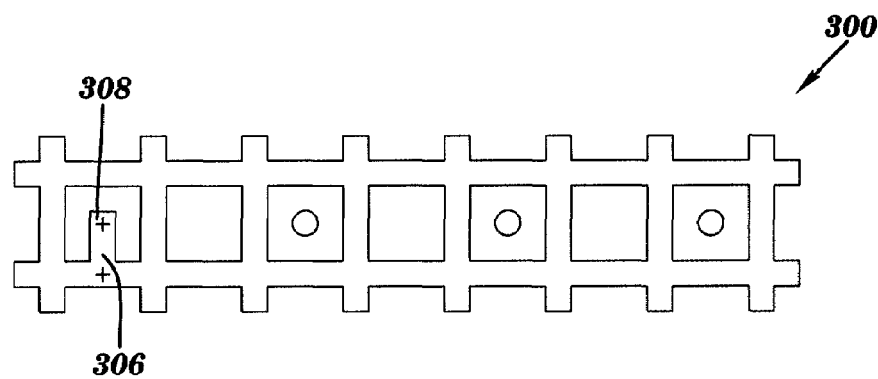

To further illustrate, FIGS. 13A–13C show the same sub-layouts 302 of a much larger mesh plane layout 300. Each sub-layouts 302 (FIG. 13A only) is substantially similar to that of sub-layout 10 in prior art FIG. 1. FIG. 13A illustrates the prior art mesh plane interpretation approach described relative to FIG. 1. In this case, each "+" indicates an end of an active line, i.e., feature. In one operational example based on the interpretation of FIG. 13A, a layout 300 included 4,686 features, and resulted in a file storage size of 610 KB. FIG. 13B illustrates the four sub-layouts, each including a single active line 306 to a via 308. In this case, the activate a substantial portion-and-remove approach of the invention has been implemented such that unnecessary active lines to via 308 have been removed. As a result, the layout includes only 2,559 features and results in a file storage size of 332 KB, i.e., a 46% reduction compared to that for FIG. 13A. FIG. 13C illustrates the four sub-layouts in a more common situation where only one via 308 is interconnected to the mesh plane. In this case, the activate a substantial portion-and-remove approach and multiple line shape storage approaches of the invention have been implemented such that the layout includes only 1,915 features and results in a file storage size of 248 KB, i.e., a 59% reduction compared to that for FIG. 13A.

In the previous discussion, it will be understood that the method steps discussed are performed by a processor, such as CPU 34 of system 30, executing instructions of program product 42 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method of generating a mesh plane for an IC carrier design, the mesh plane being defined on a field of grid points, the method comprising steps of:
   activating a substantial portion of grid points of an intended mesh plane with active lines;
   removing at least one active line to generate the mesh plane; and
   storing a set of active lines of the mesh plane as a multiple line shape.

2. The method of claim 1, wherein the activating step includes filling the substantial portion of grid points of the intended mesh plane with active lines, and then doubling a density of the intended mesh plane.

3. The method of claim 1, wherein the multiple line shape is selected from a group consisting of: a plus shape, a right angle, a square and a rectangle.

4. The method of claim 1, further comprising a step of storing a plurality of collinear active lines as an un-segmented line.

5. The method of claim 1, further comprising a step of constructing the mesh plane using the stored multiple line shape.

6. The method of claim 1, wherein the removing step includes removing at least one active line between a surrounded grid point, which is surrounded by other grid points that are not on a via, and the other grid points.

7. The method of claim 1, further comprising a step of establishing a via pattern prior to the activating step, and wherein the removing step includes removing at least one active line to a grid point associated with a passthrough via that is not of a same network as the mesh plane.

8. The method of claim 1, wherein the removing step includes removing an active line between a dangling grid point that is not associated with a via and only one other grid point.

9. A method of generating a mesh plane for an IC carrier design, the method comprising steps of:
   generating a mesh plane having a plurality of active lines; and
   storing a set of active lines of the mesh plane as a multiple line shape.

10. The method of claim 9, wherein the mesh plane is defined on a field of grid points, and the generating step includes:
    activating a substantial portion grid points of an intended mesh plane with active lines, and
    removing at least one active line to generate the mesh plane.

11. The method of claim 10, wherein the removing step includes at least one of:
    removing at least one active line between a surrounded grid point, which is surrounded by other grid points that are not on a via, and the other grid points;
    removing any active line to a grid point associated with a passthrough via that is not of a same network as the mesh plane based on a via pattern; and
    removing an active line between a dangling grid point that is not associated with a via and only one other grid point.

12. The method of claim 9, further comprising a step of storing a plurality of collinear active lines as an un-segmented line.

13. The method of claim 9, further comprising a step of constructing the mesh plane using the stored multiple line shape.

14. A computer program product comprising a computer useable medium having computer readable program code embodied therein for generating a mesh plane for an IC carrier design where the mesh plane is defined on a field of grid points, the program product comprising:
    program code configured to activate a substantial portion of grid points of an intended mesh plane with active lines;
    program code configured to remove at least one active line to generate the mesh plane; and
    program code configured to store a set of active lines of the mesh plane as a multiple line shape.

15. The program product of claim 14, wherein the multiple line shape is selected from a group consisting of: a plus shape, a right angle, a square and a rectangle.

16. The program product of claim 14, further comprising program code configured to store a plurality of collinear active lines as an un-segmented line.

17. The program product of claim 14, wherein the removing program code includes program code configured to remove at least one active line between a surrounded grid point, which is surrounded by other grid points that are not on a via, and the other grid points.

18. The program product of claim 14, further comprising program code configured to remove any active line to a grid point associated with a passthrough via that is not of a same network as the mesh plane.

19. The program product of claim 14, wherein the removing program code includes program code configured to remove an active line between a dangling grid point that is not associated with a via and only one other grid point.

20. A computer program product comprising a computer useable medium having computer readable program code embodied therein for generating a mesh plane for an IC carrier design, the program product comprising:
    program code configured to generate a mesh plane having a plurality of active lines; and
    program code configured to store a set of active lines of the mesh plane as a multiple line shape.

21. The program product of claim 20, wherein the mesh plane is defined on a field of grid points, and the generating program code includes:
    program code configured to activate a substantial portion of grid points of an intended mesh plane with active lines, and
    program code configured to remove at least one active line to generate the mesh plane.

22. The program product of claim 21, wherein the removing program code includes program code configured to:
    remove at least one active line between a surrounded grid point, which is surrounded by other grid points that are not on a via, and the other grid points;
    remove any active line to a grid point associated with a passthrough via that is not of a same network as the mesh plane; and
    remove an active line between a dangling grid point that is not associated with a via and only one other grid point.

23. The program product of claim 20, wherein the multiple line shape is selected from a group consisting of: a plus shape, a right angle, a square and a rectangle.

24. The program product of claim 20, further comprising program code configured to store a plurality of collinear active lines as an un-segmented line.

25. An IC carrier design system comprising:
a mesh plane generating unit including:
means for activating a substantial portion of grid points of an intended mesh plane with active lines, the grid points being part of a field used to define the mesh plane; and means for removing at least one active line to generate the mesh plane; and
a mesh plane storage unit including means for storing a set of active lines of the mesh plane as a multiple line shape.

26. The IC carrier design system of claim 25, wherein the mesh plane storage unit further includes means for storing a plurality of collinear active lines as an un-segmented line.

27. The IC carrier design system of claim 25, wherein the mesh plane generating unit further includes:
means for removing at least one active line between a surrounded grid point, which is surrounded by other grid points that are not on a via, and the other grid points;
means for removing any active line to a grid point associated with a passthrough via that is not of a same network as the mesh plane; and
means for removing an active line between a dangling grid point that is not associated with a via and only one other grid point.

28. The IC carrier design system of claim 25, further comprising a mesh plane constructor for reconstructing a mesh plane based on the multiple line shape.

* * * * *